(12) United States Patent
Shooshtari et al.

(10) Patent No.: US 7,838,448 B2
(45) Date of Patent: Nov. 23, 2010

(54) FIBERGLASS BINDER UTILIZING A CURABLE ACRYLATE AND/OR METHACRYLATE

(75) Inventors: Kiarash Alavi Shooshtari, Littleton, CO (US); Diana Kim Fisler, Littleton, CO (US)

(73) Assignee: Johns Manville, Denver, CO (US)

( * ) Notice: Subject to any disclaimer, the term of this patent is extended or adjusted under 35 U.S.C. 154(b) by 225 days.

(21) Appl. No.: 11/998,348

(22) Filed: Nov. 29, 2007

(65) Prior Publication Data

US 2008/0090077 A1    Apr. 17, 2008

Related U.S. Application Data

(62) Division of application No. 11/075,201, filed on Mar. 8, 2005, now Pat. No. 7,321,010.

(51) Int. Cl.
 *B32B 17/02* (2006.01)
(52) U.S. Cl. .................. 442/180; 524/461; 524/556
(58) Field of Classification Search .............. 442/180; 524/461, 556; 526/171, 213, 317.1; 428/392
See application file for complete search history.

(56) References Cited

U.S. PATENT DOCUMENTS 5,275,874 A * 1/1994 Brandenburg et al. ....... 442/327

FOREIGN PATENT DOCUMENTS

EP     0 826 710     * 4/1998

* cited by examiner

*Primary Examiner*—Lynda Salvatore
(74) *Attorney, Agent, or Firm*—Robert D. Touslee

(57) ABSTRACT

A curable formaldehyde-free binding composition for use with fiberglass is provided. Such curable composition comprises a substantially unpolymerized acrylate and/or methacrylate primarily having no more than approximately six recurring moieties. The composition is either unpolymerized at the time of its application to the fiberglass or in the form of an oligomer. The curable composition is coated on fiberglass and thereafter is cured to form a secure binder. In a preferred embodiment the fiberglass is the form of building insulation. In other embodiments the product is a microglass-based substrate useful for as a printed circuit board, battery separator, filter stock, or reinforcement scrim.

17 Claims, No Drawings

FIBERGLASS BINDER UTILIZING A CURABLE ACRYLATE AND/OR METHACRYLATE

This application is a division of application Ser. No. 11/075,201, filed Mar. 8, 2005 now U.S. Pat. No. 7,321,010. The subject invention pertains to an improved binding composition for use with fiberglass. More specifically, the subject invention pertains to a curable composition comprising a substantially unpolymerized acrylate and/or methacrylate that has been found to be well suited to bind a fiberglass product. Once applied as a coating to the fiberglass the binding composition is cured. The binder of the present invention is useful as a fully acceptable replacement for formaldehyde-based binders in non-woven fiberglass products.

BACKGROUND OF THE INVENTION

1. Field of the Invention
2. Description of the Related Art

Fiberglass binders have a variety of uses ranging from stiffening applications where the binder is applied to woven or non-woven fiberglass sheet goods and cured, producing a stiffer product; thermo-forming applications wherein the binder resin is applied to a sheet or lofty fibrous product, following which it is dried and optionally B-staged to form an intermediate but yet curable product; and to fully cured systems such as building insulation.

Fibrous glass insulation products generally comprise matted glass fibers bonded together by a cured thermoset polymeric material. Molten streams of glass are drawn into fibers of random lengths and blown into a forming chamber where they are randomly deposited as a mat onto a traveling conveyor. The fibers, while in transit in the forming chamber and while still hot from the drawing operation, are sprayed with an aqueous binder. A phenol-formaldehyde binder has been used throughout the fibrous glass insulation industry. The residual heat from the glass fibers and the flow of air through the fibrous mat during the forming operation are generally sufficient to volatilize water from the binder, thereby leaving the remaining components of the binder on the fibers as a viscous or semi-viscous high solids liquid. The coated fibrous mat is transferred to a curing oven where heated air, for example, is blown through the mat to cure the binder and rigidly bond the glass fibers together.

Fiberglass binders used in the present sense should not be confused with matrix resins which are an entirely different and non-analogous field of art. While sometimes termed "binders", matrix resins act to fill the entire interstitial space between fibers, resulting in a dense, fiber reinforced product where the matrix must translate the fiber strength properties to the composite, whereas "binder resins" as used herein are not space-filling, but rather coat only the fibers, and particularly the junctions of fibers. Fiberglass binders also cannot be equated with paper or wood product "binders" where the adhesive properties are tailored to the chemical nature of the cellulosic substrates. Many such resins are not suitable for use as fiberglass binders. One skilled in the art of fiberglass binders would not look to cellulosic binders to solve any of the known problems associated with fiberglass binders.

Binders useful in fiberglass insulation products generally require a low viscosity in the uncured state, yet characteristics so as to form a rigid thermoset polymeric mat for the glass fibers when cured. A low binder viscosity in the uncured state is required to allow the mat to be sized correctly. Also, viscous binders tend to be tacky or sticky and hence they lead to accumulation of fiber on the forming chamber walls. This accumulated fiber may later fall onto the mat causing dense areas and product problems. A binder which forms a rigid matrix when cured is required so that a finished fiberglass thermal insulation product, when compressed for packaging and shipping, will recover to its as-made vertical dimension when installed in a building.

From among the many thermosetting polymers, numerous candidates for suitable thermosetting fiberglass binder resins exist. However, binder-coated fiberglass products are often of the commodity type, and thus cost becomes a driving factor, generally ruling out such resins as thermosetting polyurethanes, epoxies, and others. Due to their excellent cost/performance ratio, the resins of choice in the past have been phenol-formaldehyde resins. Phenol-formaldehyde resins can be economically produced, and can be extended with urea prior to use as a binder in many applications. Such urea-extended phenol-formaldehyde binders have been the mainstay of the fiberglass insulation industry for years, for example.

Over the past several decades however, minimization of volatile organic compound emissions (VOCs) both on the part of the industry desiring to provide a cleaner environment, as well as by Federal regulation, has led to extensive investigations into not only reducing emissions from the current formaldehyde-based binders, but also into candidate replacement binders. For example, subtle changes in the ratios of phenol to formaldehyde in the preparation of the basic phenol-formaldehyde resole resins, changes in catalysts, and addition of different and multiple formaldehyde scavengers, has resulted in considerable improvement in emissions from phenol-formaldehyde binders as compared with the binders previously used. However, with increasingly stringent Federal regulations, more and more attention has been paid to alternative binder systems which are free from formaldehyde.

One such candidate binder system employs polymers of acrylic acid as a first component, and a polyol such as glycerine or a modestly oxyalkylated glycerine as a curing or "crosslinking" component. The preparation and properties of such poly(acrylic acid)-based binders, including information relative to the VOC emissions, and a comparison of binder properties versus urea-formaldehyde binders is presented in "Formaldehyde-Free Crosslinking Binders For Non-Wovens", Charles T. Arkins et al., TAPPI JOURNAL, Vol. 78, No. 11, pages 161-168, November 1995. The binders disclosed by the Arkins article, appear to be B-stageable as well as being able to provide physical properties similar to those of urea/formaldehyde resins.

U.S. Pat. No. 5,340,868 discloses fiberglass insulation products cured with a combination of a polycarboxy polymer, a-hydroxyalkylamide, and at least one trifunctional monomeric carboxylic acid such as citric acid. The specific polycarboxy polymers disclosed are poly(acrylic acid) polymers. See also, U.S. Pat. No. 5,143,582

U.S. Pat. No. 5,318,990 discloses a fibrous glass binder which comprises a polycarboxy polymer, a monomeric trihydric alcohol and a catalyst comprising an alkali metal salt of a phosphorous-containing organic acid.

Published European Patent Application EP 0 583 086 A1 appears to provide details of polyacrylic acid binders whose cure is catalyzed by a phosphorus-containing catalyst system as discussed in the Arkins article previously cited. Higher molecular weight poly(acrylic acids) are stated to provide polymers exhibiting more complete cure. See also U.S. Pat. Nos. 5,661,213; 5,427,587; 6,136,916; and 6,221,973.

Some polycarboxy polymers have been found useful for making fiberglass insulation products. Problems of clumping or sticking of the glass fibers to the inside of the forming chambers during the processing, as well as providing a final product that exhibits the recovery and rigidity necessary to provide a commercially acceptable fiberglass insulation product, have been overcome. See, for example, U.S. Pat. No. 6,331,350. The thermosetting acrylic resins have been found to be more hydrophilic than the traditional phenolic binders, however. This hydrophilicity can result in fiberglass insulation that is more prone to absorb liquid water, thereby possibly compromising the integrity of the product. Also, the thermosetting acrylic resins now being used as binding agents for fiberglass have been found to not react as effectively with silane coupling agents of the type traditionally used by the industry. The addition of silicone as a hydrophobing agent results in problems when abatement devices are used that are based on incineration. Also, the presence of silicone in the manufacturing process can interfere with the adhesion of certain facing substrates to the finished fiberglass material. Overcoming these problems will help to better utilize polycarboxy polymers in fiberglass binders.

Accordingly, it is an objective of the present invention to provide a novel, non-phenol-formaldehyde binder.

It is an object of the invention to provide a novel fiberglass binder which provides advantageous flow properties, the possibility of lower binder usage, the possibility of overall lower energy consumption, possible elimination of water usage, elimination of interference by a silane, and improved overall economics.

These and other objects of the present invention will become apparent to the skilled artisan upon a review of the following description and the claims appended hereto.

SUMMARY OF THE INVENTION

A curable composition is provided for use in the binding of fiberglass comprising a substantially unpolymerized acrylate and/or methacrylate primarily having no more than approximately six recurring moieties.

A process for binding fiberglass is provided comprising applying to the fiberglass a coating of a composition comprising a curable substantially unpolymerized acrylate and/or methacrylate primarily having no more than approximately six recurring moieties, and thereafter curing said composition while present on said fiberglass.

In a preferred embodiment the resulting fiberglass product is building insulation. In other embodiments the fiberglass product is a microglass-based substrate useful for a printed circuit board, battery separator, filter stock, or reinforcement scrim.

DETAILED DESCRIPTION OF PREFERRED EMBODIMENTS

The novel fiberglass binder of the present invention is a curable composition comprising a substantially unpolymerized acrylate and/or methacrylate. The composition is either unpolymerized at the time of its application to the fiberglass or in the form of an oligomer primarily having no more than approximately six recurring moieties. In a preferred embodiment the oligomer has approximately two to six recurring moieties. The chain length of the oligomer advantageously can be adjusted as desired so as to modify the properties of the binder. A minor concentration of an oligomer having in excess of six moieties can be present in the composition so long as the presence of such moieties having a longer chain size do not interfere with the advantageous results made possible by the present invention.

In a further preferred embodiment the curable composition comprises a mixture of acrylate and/or methacrylate monomers combined with oligomers thereof having approximately 2 to 6 recurring moieties.

The acrylate and/or methacrylate monomers for use in the present invention include those that linear- or branched-aliphatic, cyclo-aliphatic, or aromatic-monoesters of acrylic acid and/or methacrylic acid. The methacrylate monomers are particularly preferred.

Suitable monomers include the linear aliphatic monoesters of acrylic acid, branched aliphatic monoesters of acrylic acid, linear aliphatic monoesters of methacrylic acid, branched aliphatic monoesters of methacrylic acid, cycloaliphatic monoesters of acrylic acid, cycloaliphatic monoesters of methacrylic acid, aromatic monoesters of acrylic acid, and aromatic monoesters of methacrylic acid, and mixtures of these. Representative monomers are methyl methacrylate, butyl methacrylate, hydroxyethyl methacrylate, hydroxypropyl methacrylate, cyclohexyl methacrylate, isobornyl methacrylate, stearic methacrylate, benzyl acrylate, benzyl methacrylate, etc.

The acrylate and/or methacrylate monomer can be partially polymerized to a relatively short chain length and/or combined with other reactive components. Such other reactive components include di-, tri- and multi-functional reactive components. For instance, the monomer can be a di-, tri-, or multi-functional epoxy methacrylate, urethane methacrylate, glycol methacrylate, polyether methacrylate, polyester methacrylate, polyalkyl methacrylate, and mixtures thereof. Further examples include bisphenol A methacrylate, bisphenol A epoxy methacrylate, ethoxylated bisphenol A methacrylate, ethylene glycol dimethacrylate, tripropylene glycol dimethacrylate, trimethyol propane trimethacrylate, pentaerythrytol tetramethyacrylate, hexanediol dimethacrylate, toluene dicarbamate dimethacrylate, and mixtures thereof.

The acrylate and/or methacrylate monomer optionally can be combined with other monomers that include at least one reactive double bond. Representative of such comonomers are unsaturated aromatic hydrocarbons, such as styrene, vinyltoluene, divinylbenzene, and mixtures of these. Alternatively, an unsaturated polyester, such as that formed by the reaction of maleic anhydride and diethyleneglycol can serve as the monomer that is combined with the acrylate and/or methacrylate.

In another embodiment a methacrylate monomer is utilized that the reaction product of a methacrylic monomer and a reactive component selected from the plant or animal oils, functionalized plant (e.g., epoxidized soybean oil) or animal oils, diisocyanates (e.g., methylene diphenyl diisocyante), anhydrides (e.g., maleic anhydride), carboxylic acids, and mixtures thereof. For instance, the functionalized plant or animal oil may hydroxylated or epoxidized. Representative plant oils are linseed oil, soybean oil, rapeseed oil, castor oil, palm oil, sunflower oil, and mixtures of these.

In a further embodiment a methacrylate monomer is utilized that contains other functional groups that are imparted by reaction with a reactive component selected from carboxylic acids, alcohols, urea, vinyl esters, vinyl acids, allyl esters, allyl ethers, allyl amines, amides, nitriles, and mixtures of these.

The curable composition of the present invention is applied to the fiberglass in the form of a flowable liquid which may be neat, dissolved in water and/or organic solvents, or emulsified in water at the time of its application.

Such composition commonly will include an initiator such as benzophenone, azoisobutyronitrile, cumyl hydroperoxide, benzoyl peroxide, or a catalyst such as triethyl amine and Cobalt octanoate in order to expedite the subsequent curing in the presence of the fiberglass.

The composition also may include adhesion prompters, oxygen seavengers, solvents, emulsifiers, pigments, fillers, anti-migration aids, coalescents, wetting agents, biocides, plasticizers, organosilanes, anti-foaming agents, colorants, waxes, suspending agents, anti-oxidants, crosslinking catalysts, secondary crosslinkers, and combinations thereof.

The fiberglass that is coated with the composition according to the present invention may take a variety of forms and in a preferred embodiment is building insulation. In other embodiments the fiberglass is a microglass-based substrate useful in applications such as printed circuit boards, battery separators, filter stock, and reinforcement scrim.

The composition of the present invention can be coated on the fiberglass by a variety of techniques. In preferred embodiments these include spraying, spin-curtain coating, and dipping-roll coating. The composition can be applied to freshly-formed fiberglass, or to the fiberglass following collection.

Thereafter the composition undergoes curing wherein the acrylate and/or methacrylate undergoes chemical reaction and to serve a role as an improved binder for the fiberglass. Such curing can be conducted at ambient temperature. However, elevated curing temperatures up to approximately 300° C. are acceptable in order to expedite the curing to form a stable and secure polymeric coating. As will be apparent to those skilled in the art, the curing temperature will be influenced by the nature of any curing catalyst that is present. For instance when benzoyl peroxide is the curing catalyst, curing temperatures of approximately 70 to 150° C. commonly are utilized.

The cured acrylate and/or methacrylate at the conclusion of the curing step commonly is present as a secure coating on the fiberglass in a concentration of approximately 0.5 to 50 percent by weight of the fiberglass, and most preferably in a concentration of approximately 1 to 10 percent by weight of the fiberglass.

The present invention provides a formaldehyde-free route to form a securely bound formaldehyde-free fiberglass product. The binder composition of the present invention provides advantageous flow properties and offers the possibility of lower binder usage, lower overall energy consumption, the possible elimination of water usage, elimination of interference by a silane, and improved overall economics.

The following examples are presented to provide specific examples of the present invention. In each instance the thin glass plate substrate that receives the coating can be replaced by fiberglass. It should be understood, however, that the invention is not limited to the specific details set forth in the Examples.

EXAMPLE 1

To 26.0 g of hydroxyethyl methacrylate are added 13.5 g of methylene diphenyl diisocyante with stirring at ambient temperature. The methylene diphenyl diisocyante dissolves in the hydroxyethyl methacrylate and the stirring continues for 24 hours to form a curable composition. During this time a substantially unpolymerized reaction product is formed and is present as a flowable syrup. To 5 g of this flowable syrup 0.10 g of benzoyl peroxide initiator and 0.05 g Cobalt octanoate is added and is dissolved. This syrup next is coated on a thin glass plate and is cured at 200° C. for 5 minutes to create a secure coating thereon in a concentration of approximately 5 percent by weight based on the weight of the thin glass substrate. The resulting coating adheres well, and is hard, durable, and water resistant.

EXAMPLE 2

Example 1 is substantially repeated with the exception that 39.0 g of hydroxyethyl methacrylate are utilized. The curable composition displays a lower viscosity and the resulting product possesses the advantageous properties of Example 1.

EXAMPLE 3

Example 2 is substantially repeated with the exception that 0.10 g of triethyl amine additionally is added to methylene diphenyl diisocyanate and the hydroxyethyl methacrylate and the stirring is continued for 1 hour instead of 24 hours. The presence of the triethyl amine serves the role of a catalyst and the initial formation of the curable composition and its curing are expedited. The advantageous properties of Example 1 are similarly displayed.

EXAMPLE 4

Acrylic acid in a quantity of 7.2 g is mixed with 13.5 g of methyl diphenyl diisocyanate with stirring at ambient temperature for 24 hours to form an initial reaction product in the form of a paste. The paste next is dissolved in 13.0 g of hydroxyethyl methacrylate to form a flowable syrup. To 5 g of this flowable syrup 0.10 g of benzoyl peroxide and 0.05 g Colbalt octanoate is added and dissolved. This syrup next is coated on a thin glass plate and is cured at 200° C. for 5 minutes to create a secure coating in a concentration of approximately 5 percent by weight based on the weight of the thin glass plate. The advantageous properties of Example 1 are similarly displayed.

EXAMPLE 5

To 13.0 g of hydroxyethyl methacrylate and 10.0 g of methyl methacrylate are added 13.5 g of methyl diphenyl diisocyanate with stirring at ambient temperature. The methyl diphenyl diisocyanate dissolves and the stirring continues for 24 hours to form a curable composition. During this time a substantially unpolymerized reaction product is formed and is present as a flowable syrup. To 5 g of this flowable syrup 0.10 g of benzoyl peroxide initiator and 0.05 g Cobalt octanoate is added and is dissolved. This syrup next is coated on a thin glass plate and is cured at 200° C. for 5 minutes to a secure coating in a concentration of approximately 5 percent by weight based on the weight of the fiberglass insulation. The advantageous properties of Example 1 are similarly displayed.

EXAMPLE 6

In a mixture of 13.0 g of hydroxyethyl methacrylate and 14.2 g of butyl methacrylate are dissolved 10.0 g of trimethylol propane trimethacrylate with stirring at ambient temperature to form a curable syrup. To 5 g of this flowable syrup 0.10 g of benzoyl peroxide initiator and 0.05 g Cobalt octanoate is added and is dissolved. This syrup next is coated on a thin glass plate and is cured at 200° C. for 5 minutes to create a secure coating in a concentration of approximately 5 percent by weight based on the weight of the thin glass plate. The curable composition displays a low viscosity and the resulting coating adheres well, is flexible, durable, and water resistant.

EXAMPLE 7

The epoxidized linseed oil is purchased from C.P. Hall Co. of Chicago, Ill., U.S.A. To 7.2 g of acrylic acid are mixed 14.5 g of the epoxidized soybean oil with stirring for 6 hours at 50° C. to produce an acetylated linseed oil reaction product in the form of a viscous liquid. This reaction product next is mixed with 13.0 g of hydroxyethyl methacrylate to yield a flowable syrup. To 5 g of this flowable syrup 0.10 g of benzoyl peroxide initiator and 0.05 g Cobalt octanoate is added and is dissolved. This syrup next is coated on thin glass plate and is cured at 200° C. for 5 minutes to create a secure coating in a concentration of approximately 5 percent by weight based on the weight of the thin glass plate. The product displays a flexible coating that adheres well, is durable, is water resistant.

EXAMPLE 8

To 13.0 g of hydroxyethyl methacrylate are added and dissolved 9.8 g of maleic anhydride with stirring at 60° C. To this warm solution are added and dissolved 0.10 g of triethyl amine catalyst and stirring is continued for 1 hour as the solution cools to ambient temperature. To this solution are added and dissolved 13.5 g of methylene diphenyl diisocyanate and stirring continues for 1 hour at ambient temperature to form a viscous solution. To this viscous solution are added and dissolved another 13.0 g of hydroxyethyl methacrylate and the solution is stirred for 10 minutes at ambient temperature. To 5 g of the resulting flowable syrup 0.10 g of benzoyl peroxide initiator and 0.05 g Cobalt octanoate is added and is dissolved. The syrup next is coated on a thin glass plate and is cured at 200° C. for 5 minutes to create a coating on the thin glass plate in a concentration of approximately 5 percent by weight based on the weight of the thin glass plate. The coating adheres well, and is hard, durable, and water resistant.

EXAMPLE 9

Initially a mixture of 14.2 g of trimethylol propane diallyl ether, 13.5 g of methylene diphenyl diisocyanate, and 0.10 g of triethylene amine is formed and is stirred for 1.0 hour at ambient temperature to form a urethane reaction product that is present as a paste. Next 10.0 g of this paste are dissolved in 13.0 g of hydroxyethyl methacrylate to form a flowable syrup. To 5 g of this flowable syrup 0.10 g of benzoyl peroxide initiator and 0.05 g Cobalt octanoate is added and is dissolved. The syrup next is coated on a thin glass plate in a concentration of approximately 5 percent by weight based on the weight of the fiberglass insulation. The coating adheres well, and is hard, durable, and water resistant.

The principles, preferred embodiments, and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

We claim:

1. A curable composition for use in the binding of fiberglass comprising a substantially unpolymerized acrylate and/or methyacrylate primarily having no more than approximately six recurring moieties; wherein said substantially unpolymerized acrylate and/or methyacrylate is selected from the group consisting of linear aliphatic monoesters of acrylic acid, branched aliphatic monoesters of acrylic acid, linear aliphatic monoesters of methacrylic acid, branched aliphatic monoesters of methacrylic acid, cycloaliphatic monoesters of acrylic acid, cycloaliphatic monoesters of methacrylic acid, aromatic monoesters of acrylic acid, and aromatic monoesters of methacrylic acid, and mixtures thereof, and the composition comprises a mixture of an acrylate and/or methyacrylate monomer in combination with oligomers thereof having approximately 2 to 6 recurring moieties.

2. A curable composition according to claim 1 wherein said monomer is a methyacrylate and is selected from the group consisting of methyl methacrylate, butyl methacrylate, hydroxyethyl methacrylate, hydroxypropyl methacrylate, cyclohexyl methacrylate, isobornyl methacrylate, stearic methacrylate, and mixtures thereof.

3. A curable composition according to claim 1 wherein said monomer is a methacrylate and is combined with an unsaturated aromatic hydrocarbon selected from the group consisting of styrene, vinyltoluene, divinylbenzene, and mixtures thereof.

4. A curable composition according to claim 1 wherein said monomer is a methacrylate and is combined with an unsaturated polyester formed by the reaction of maleic anhydride and diethyleneglycol.

5. A curable composition according to claim 1 wherein said monomer is a methacrylate and is selected from the group consisting of di, tri, and multifunctional epoxy methacrylate, urethane methacrylate, glycol methacrylate, polyether methacrylate, polyester methacrylate, polyalkyl methacrylate, and mixtures thereof 6. A curable composition according to claim 1 wherein said monomer is a methacrylate and is selected from the group consisting of bisphenol A methacrylate, bisphenol A epoxy methacrylate, ethoxylated bisphenol A epoxy methacrylate, ethylene glycol methacrylate, tripropylene glycol methacrylate, trimethylol propane trimethacrylate, pentaerythrytol tetramethacrylate, hexane diol dimethacrylate, toluene dicarbamate dimethacrylate, and mixtures thereof.

7. A curable composition according to claim 1 wherein said monomer is a methacrylate and contains other functional groups selected from the group consisting of carboxylic acid, alcohols, isocyanate, urea, vinyl esters, vinyl acids, allyl esters, allyl ethers, allyl amines, amines, and mixtures thereof.

8. A curable composition according to claim 1 wherein said monomer is a methacrylate and is the product of a methacrylic monomer and a reactive component selected from the group consisting of plant or animal oils, functionalized plant or animal oils, diisocyanates, anhydrides, carboxylic acids, and mixtures thereof.

9. A curable composition according to claim 8 wherein said functionalized plant or animal oil is a hydroxylated or epoxidized plant or animal oil.

10. A curable composition according to claim 9 wherein said functionalized plant or animal oil is selected from the group consisting of linseed oil, soybean oil, rapeseed oil, castor oil, coconut oil, palm oil, sunflower oil, and mixtures thereof.

11. A curable composition according to claim 1 further comprising at least one component selected from the group consisting of adhesion promoters, oxygen scavengers, moister repellants, solvents, emulsifiers, pigments, fillers, anti-migration aids, coalescents, wetting agents, biocides, plasticizers, organosilanes, anti-foaming agents, colorants, waxes, suspending agents, anti-oxidants, and crosslinking catalysts.

12. A curable composition according to claim 1 further comprising an initiator and/or catalyst.

13. A curable composition according to claim 1 further comprising a benzoyl peroxide initiator.

14. A formaldehyde-free fiberglass product comprised of the curable composition of claim 1.

15. The fiberglass product according to claim 14 wherein the curable composition is cured.

16. A fiberglass product according to claim 15 wherein the product is building insulation.

17. A fiberglass product according to claim 15 wherein the product is a microglass-based substrate useful for any of the printed circuit board, battery separator, filter stock, or reinforcement scrim.

* * * * *